United States Patent
Wu et al.

(10) Patent No.: US 8,253,176 B2
(45) Date of Patent: Aug. 28, 2012

(54) PHOTODIODE DEVICE AND METHOD OF MANUFACTURING THE SAME

(75) Inventors: Chan Shin Wu, Hukou Shiang (TW); Tai-Hui Liu, Hukou Shiang (TW)

(73) Assignee: Solapoint Corporation, Hukou Shiang (TW)

( * ) Notice: Subject to any disclaimer, the term of this patent is extended or adjusted under 35 U.S.C. 154(b) by 170 days.

(21) Appl. No.: 12/842,792

(22) Filed: Jul. 23, 2010

(65) Prior Publication Data
US 2011/0018081 A1 Jan. 27, 2011

(30) Foreign Application Priority Data
Jul. 24, 2009 (TW) .............................. 98124968 A

(51) Int. Cl.
*H01L 27/148* (2006.01)
(52) U.S. Cl. ................ 257/233; 257/432; 257/E31.127; 257/E33.076; 257/E33.077; 438/116
(58) Field of Classification Search .................. 257/233, 257/432, E31.127, E33.076, E33.077; 436/116
See application file for complete search history.

(56) References Cited

U.S. PATENT DOCUMENTS
2009/0176330 A1 * 7/2009 Wilson et al. .................. 438/98
* cited by examiner

*Primary Examiner* — A. Sefer
*Assistant Examiner* — Farid Khan
(74) *Attorney, Agent, or Firm* — Liu & Liu

(57) ABSTRACT

A photodiode device and methods of manufacturing the same are provided. The photodiode device comprises a light absorption layer defining a light-facing side and a back-light side; a via passing through the absorption layer, the via defining a side wall and a bottom surface; a conformal isolation layer covering the side wall and the bottom surface; a first patterned conductive layer disposed on the back-light side, the first patterned conductive layer having a first portion covering a first portion of the conformation isolation layer; a second patterned conductive layer disposed on the light-facing side of the absorption layer; and an opening through the conformal isolation layer, wherein the opening is filled with the second patterned conductive layer such that the second patterned conductive layer is connected with the first portion of the first patterned conductive layer.

9 Claims, 4 Drawing Sheets

PHOTODIODE DEVICE AND METHOD OF MANUFACTURING THE SAME

Related Application

This application claims the right of priority based on Taiwan Patent Application No. 98124968 entitled "PHOTODIODE DEVICE AND METHOD OF MANUFACTURING THE SAME", filed on Jul. 24, 2009, which is incorporated herein by reference and assigned to the assignee herein.

BACKGROUND OF THE INVENTION

1. Field of the Invention

The present invention relates to a photodiode device and method of manufacturing the same, and particularly to a flip-chip photodiode device and method of manufacturing the same.

2. Description of the Prior Art

The principle of photodiode device is based on the photovoltaic effect for converting light energy into electrical energy. The photodiode device comprises semiconductor P-N junctions with different electrical characteristics. Under the irradiation of light, the P-N junction absorbs the light and generates electric current. Generally, the N-type electrode of photodiode device is disposed on a light-facing side of photodiode device, and the P-type electrode is disposed on a back-light side, and the external connection is normally formed by wire bonding.

FIG. 1 illustrates a conventional photodiode device 100. As shown, the photodiode device 100 comprises a light absorption layer 110 having P-N junctions; a N-type electrode 120 disposed on the light-facing side; a P-type electrode 130 disposed on the back-light side; and, a substrate 140 carrying the above-mentioned layered structure. The light absorption layer 110 is formed with a recess 150, so as to expose the P-type electrode 130 disposed on the back-light side. The N-type electrode 120 and the P-type electrode 130 is connected to the external employing wire-bonding. In order for the ease of wire-bonding process, the recess 150 will usually occupy a large area resulting in the reduction of light receiving area of the light absorption layer 110, and also the reduction of performance of photodiode device 100. Thus, it is required a new photodiode device and method of manufacturing the same to improve the conventional problem.

SUMMARY OF INVENTION

Based on the above-mentioned requirement, one aspect of the present invention is to provide a flip-chip photodiode device having buried holes. The so-called buried holes indicate the vias under the light-facing side. With the buried holes of the present invention, the P-type external-contacted electrode and the N-type external-contacted electrode may be disposed on the back-light side of the photodiode device. Moreover, the dimension of the blind hole may be reduced as much as possible. There is no issue regarding too large occupied area in association with the wire bonding, so as to greatly increase the performance of photodiode device.

According to an embodiment, the present invention provides a photodiode device comprising a light absorption layer defining a light-facing side and a back-light side; a via passing through the light absorption layer, and the via defines a side wall and a bottom surface; a conformal isolation layer covering the side wall and the bottom surface; a first patterned conductive layer disposed on the back-light side of the light absorption layer, the first patterned conductive layer has a first portion covering the conformal isolation layer; a second patterned conductive layer disposed on the light-facing side of the light absorption layer; and, an opening passing through the conformal isolation layer, wherein the opening is filled with the second patterned conductive layer such that the second patterned conductive layer is connected with the first portion of the first patterned conductive layer.

On the other hand, the present invention further provides a photodiode device directly employing a heat sink element as the carrying substrate, which can reduce the thickness, weight and volume of the photodiode device, and reduce the distance between the heat sink element and the light absorption area, so as to further enhance the heat sink function of the device.

According to another embodiment, the present invention provides a photodiode device as described above, which further comprises a substrate connected with a first patterned conductive layer, in which the substrate is a heat sink device. The connection between the substrate and the first patterned conductive layer is not through wire-bonding, which will be described in details in the followed section "DETAILED DESCRIPTION OF PREFERRED EMBODIMENTS."

On further another hand, the present invention provides a method of manufacturing photodiode device. The feature of the manufacturing method according to the present invention is first to form a light absorption layer on a growing substrate; next, implementing the contact circuit on the back-light side on the light absorption layer; then, connecting another substrate with the contact circuit on the back-light layer; then, removing the growing substrate to expose the light-facing side of the light absorption layer; and, implementing the contact circuit on the light-facing layer.

According to further another embodiment, the present invention provides a method of manufacturing photodiode device, which comprises: providing a first substrate; forming a light absorption layer on the first substrate; forming a via through the light absorption layer, and the via exposes the first substrate, the via defining a side wall and a bottom surface; forming a conformal isolation layer covering the side wall and the bottom surface; forming a first patterned conductive layer on the first substrate, the first patterned conductive layer having a first portion covering the conformal isolation layer; providing a second substrate; connecting the second substrate with the first patterned conductive layer; removing the first substrate to expose the conformation isolation layer; forming an opening passing through the conformal isolation layer to expose the first portion of the first patterned conductive layer; and, forming a second patterned conductive layer on the light absorption layer, the opening being filled with the second patterned conductive layer such that the second patterned conductive layer is connected with the first portion of the first patterned conductive layer.

DETAILED DESCRIPTION OF PREFERRED EMBODIMENTS

The preferred embodiment of the present invention is illustrated by referring the accompanying drawings. The similar elements in the accompanying drawings employ the same numeral references. It should be noted that in order to clearly illustrate the present invention, each element in the accompanying drawings are not drawn to scale as the actual object. Also, in order to avoid obscuring the content of the present invention, the conventional components, related material and related processing techniques are omitted in the followed description.

FIGS. 2A to 2I illustrate a manufacturing process of a photodiode device 2000 of the present invention according to an embodiment. First referring to FIG. 2A, it provides with a first substrate 200. The first substrate 200 may be made of GaAs or other suitable III-V group material. Next, a semiconductor layer 201 is formed on the first substrate 200 using the metal organic chemical vapor deposition method (MOCVD). The semiconductor layer 201 may comprise a peeling-off layer 201a and a light absorption layer 201b. The peeling-off layer 201a is configured for temporarily connecting the first substrate 200 and the light absorption layer 201b. The material of the peeling-off layer 201a may be AlAs, InGaP, InAlP, InAlGaP and the like. The light absorption layer 201b may be a multi-layer structure of III-V group semiconductor having a plurality of p-n junctions. For example, the light absorption layer 201b may comprise InGaP layer, GaAs layer and InGaAs layer. According to the present embodiment, the thickness of the peeling-off layer 201a is preferably from 50Å to 500Å, and the thickness of the light absorption layer 201b is preferably about 5 μm-15 μm. It should be noted that the light absorption layer defines a light-facing side X and a back-light side Y. The method according to the present invention is first to conduct the process on the back-light side Y.

Figure 1:
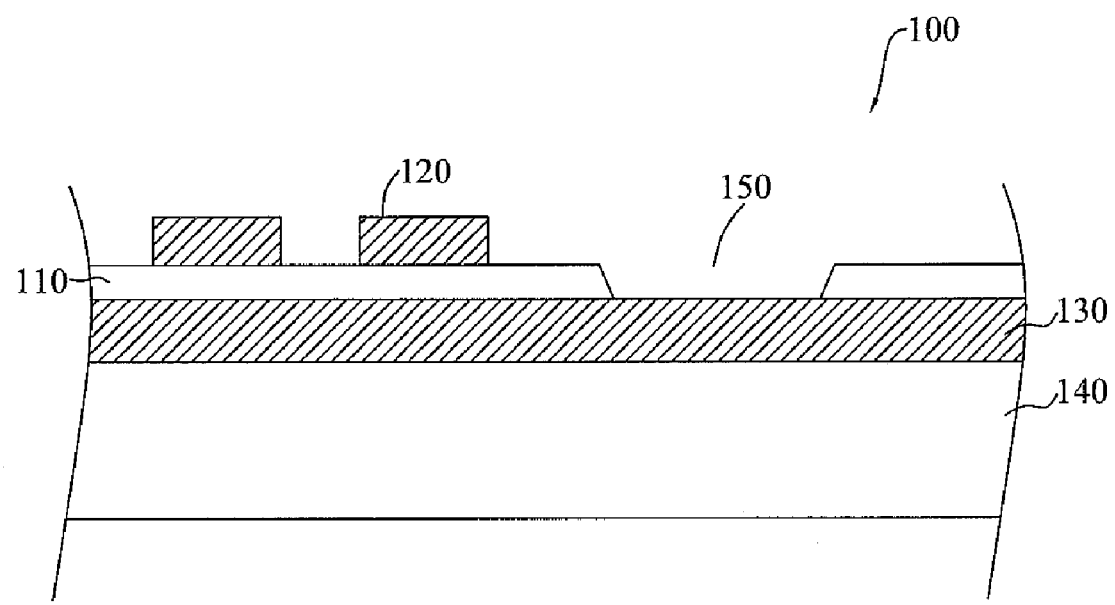
FIG. 1 shows a cross-sectional view of a conventional photodiode device.
Figure 2A:
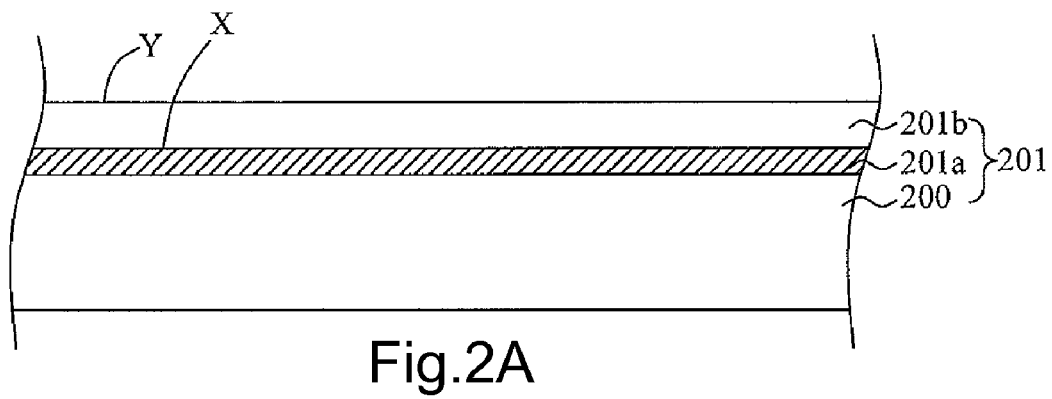
FIG. 2A to 2I show cross-sectional views of a photodiode device during its manufacturing process of one embodiment in accordance with the present invention.
Figure 2B:
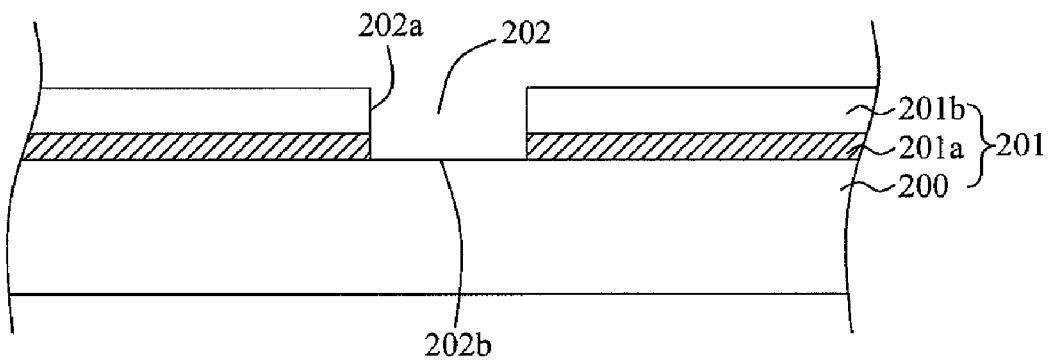

Referring to FIG. 2B, it is formed with a via 202 passing through the light absorption layer 201b and the peeling-off layer 201a. The via 202 exposes the first substrate 200 underneath, and defines a sidewall 202a and a bottom surface 202b. The forming method of the via 202 may employ the conventional lithography etching technique. The diameter of the via 202 may be changed according to the actual requirement, and may be ranged about 20 μm to 200 μm in a preferred embodiment.

Figure 2C:
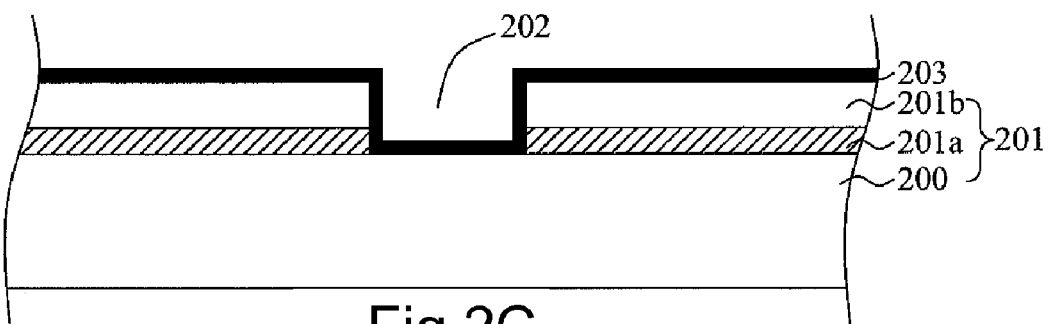

Referring to FIG. 2C, a conformal isolation layer 203 is formed covering the top surface of the structured formed in FIG. 2B. The material of the conformal isolation layer 203 may be SiN, SiO, TiO, AlO or other suitable material. The step may be executed using conventional methods, such as PECVD (Plasma Enhanced Chemical Vapor Deposition), sputtering, evaporating, or atom layer deposition (ALD) method. According to the present embodiment, the thickness of the conformal isolation layer 203 is preferably between 500Å to 4,000Å.

Figure 2D:
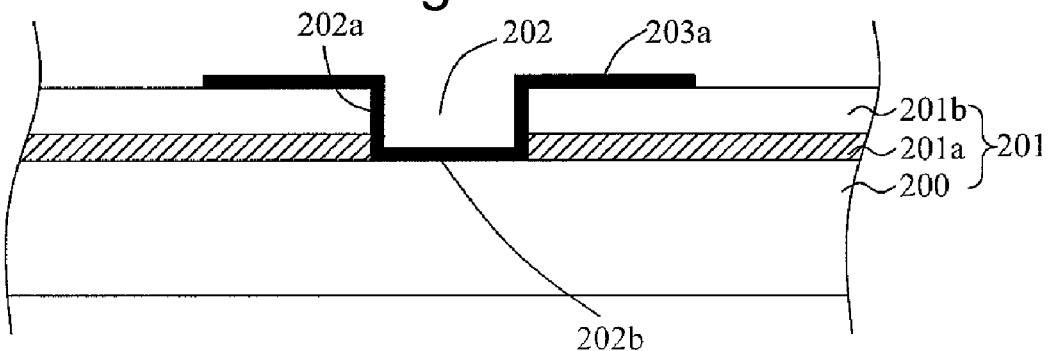
Figure 2E:
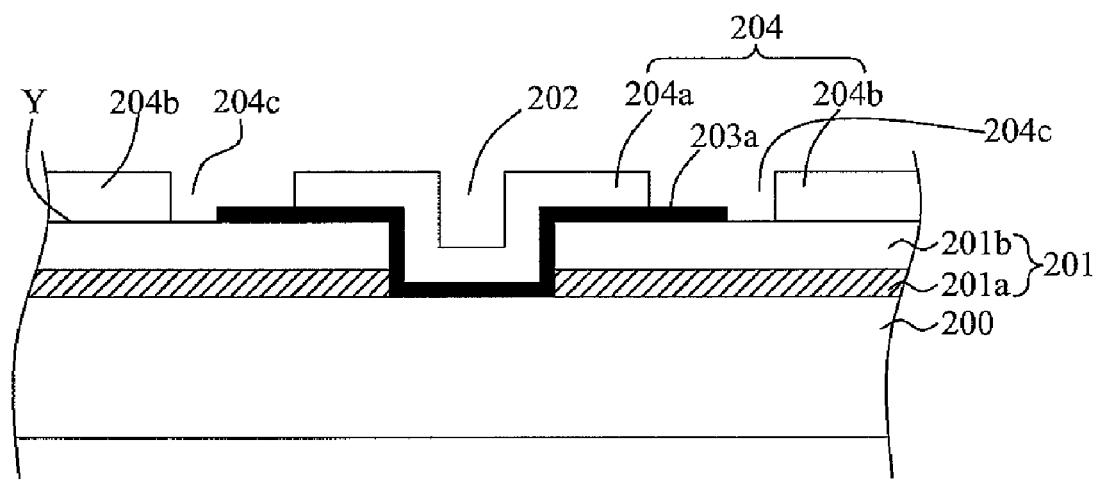

Referring to FIG. 2D, the conformal isolation layer 203 is patterned with a conventional lithography etching technique to expose the semiconductor layer 201 underneath. As shown in the figure, the patterned conformal isolation layer 203a covers the side wall 202a and the bottom surface 202b of the via 202, and a portion of top surface of the light absorption layer 201b. The conformal isolation layer 203a is configured for separating the light absorption layer 201b from the first portion 204a of the first patterned conductive layer 204 to be formed in the following (as shown in FIG. 2E). The present embodiment illustrates a preferred structure for separating the conformal isolation layer 203a from the first portion 204a. However, the present invention is not limited to the present embodiment. Other suitable isolation structure may fall within the scope of the present invention. For example, in other embodiments, the conformal isolation layer 203a may cover the side wall 202a and the bottom surface 202b, but not extend to the top surface of the light absorption layer 201b or only cover the side wall 202a.

Next referring to FIG. 2E, a first patterned conductive layer 204 is formed on a first substrate 200. As shown in the figure, the first patterned conductive layer 204 is disposed on the back-light side Y of the light absorption layer 201b. The first patterned conductive layer 204 has a first portion 204a covering the conformal isolation layer 203a; and, a second portion 204b covering a portion of top surface of the light absorption layer 201b. It should be noted the first portion 204a and the second portion 204b is separated with each other with a spacer 204c. The manufacturing of the first patterned conductive layer 204 may employ the conventional deposition or metal sputtering technique to form a conformal conductive layer along the surface of the structure as shown in FIG. 2D; then, employ the conventional lithography etching technique to establish the required pattern. The material of the first patterned conductive layer 204 may be any suitable metal, such as Al, Cu, Ag, Ti, Ge or alloy of above-listed, and the preferred thickness is ranged between 10 pm to 30 pm. In the present embodiment, the first portion 204a is the N-type (or P-type) external contacted electrode; and the second portion 204b is the P-type (or N-type) external contacted electrode. The first portion 204a and the second portion 204b have opposite electricity, and they should be separated from each other.

Herein, it should be noted that the first patterned conductive layer 204 may be a non-conformal structure. In other words, in another embodiment, the via 202 in FIG. 2E may be completely filled with conductive material. In further another embodiment, the spacer 204c may be further filled with dielectric material; then, employing suitable polishing technique to polish the top surface of the first portion 204a and the second portion 204b, such that the first portion 204a and the second portion 204b may be a flat coplanar structure.

Figure 2F:
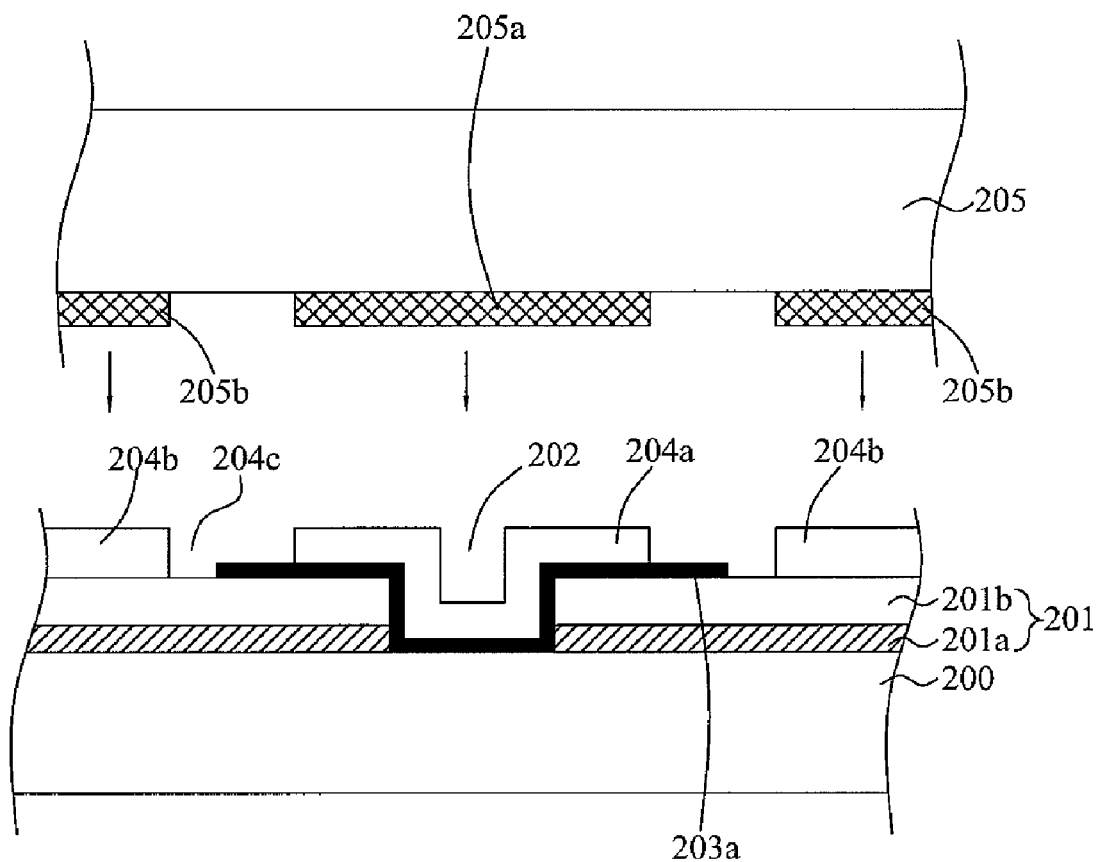

As shown in FIG. 2F, after completing the first patterned conductive layer 204 on the back-light side Y, it is next provided with a second substrate 205, and connected with the first patterned conductive layer 204. The second substrate 205 may be any suitable substrate which should have sufficient thickness to support the semiconductor layer 201, the first patterned conductive layer 204 and the second patterned conductive layer to be formed in the following. Preferably, the second substrate 205 has a thickness between 0.3 μm to 1 μm, which may be a heat sink substrate, and its material comprises a ceramic substrate, a print circuit board, a ceramic direct bonding copper (DBC) substrate. Referring to FIG. 2F, the second substrate 205 further comprises a first conductive pad 205a and a second conductive pad 205b. The step of connecting the second substrate 205 and the first patterned conductive layer 204 comprises spraying suitable adhesive, such as silver glue or conductive polymer material, on the first conductive pad 205a and the second conductive pad 205b; then, connecting the first conductive pad 205a with the first portion 204a; and, connecting the second conductive pad 205b with the second portion 204b.

Figure 2G:
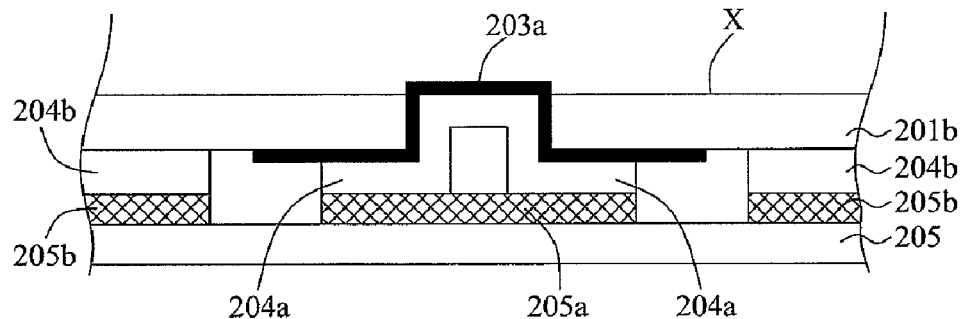

Referring to FIG. 2G, after completing the step of connecting the second substrate 205, the first substrate 200 is removed to expose the conformal isolation layer 203 and the light-facing side X of the light absorption layer 201b. The step of removing the first substrate 200 is to dip the first substrate 200 and the peeling-off layer 201a in a suitable aqueous solution. The aqueous solution may be de-ionized water, or an aqueous solution containing HF or $H_2O_2$. Because the peeling-off layer 201a will be dissolved in the solution, the first substrate 200 may be separated from the light absorption layer 201b. It should be noted that the prevent invention also comprises the embodiment without forming the peeling-off layer 201a in advance. In such an embodiment, the removal of the first substrate 200 may employ the conventional etching technique, polishing technique or laser peeling technique.

Figure 2H:
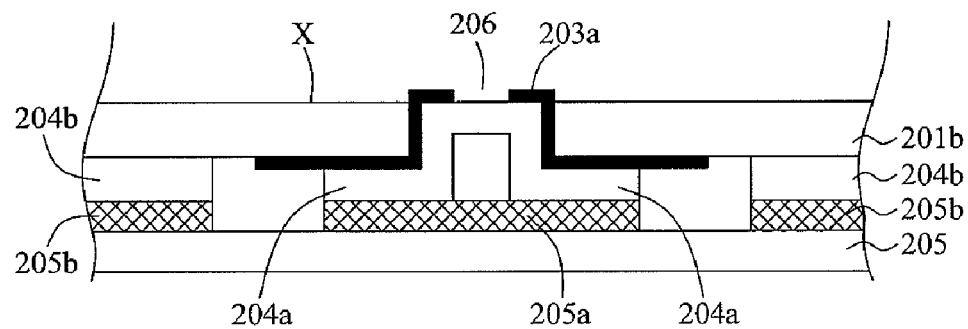

Next referring to FIG. 2H, an opening 206 is formed passing through the conformal isolation layer 203a to expose the first portion 204a of the first patterned conductive layer 204. The forming of the opening 206 may employ the conventional lithography etching technique.

Figure 2I:
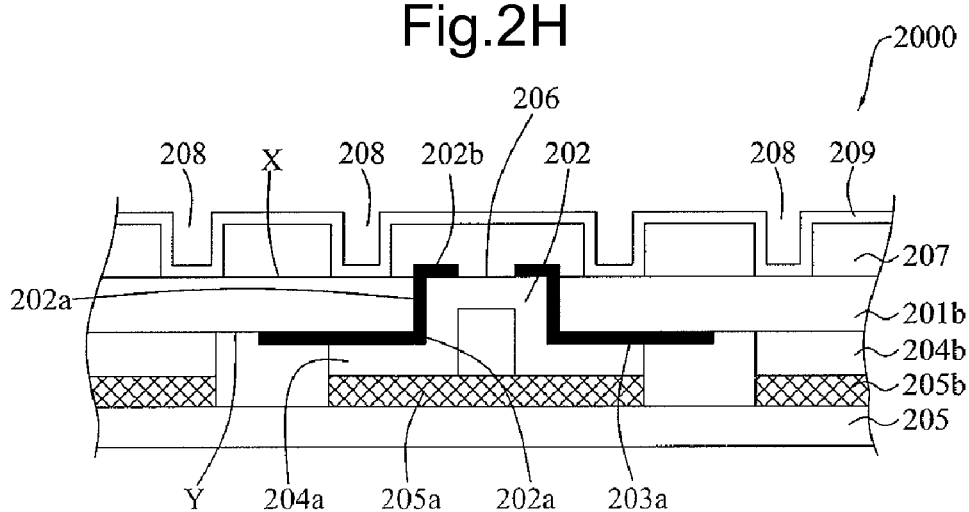

Then referring to FIG. 2I, a second patterned conductive layer 207 is formed on the light-facing side X of the light absorption layer 201b; next, forming a conformal anti-reflective layer 209 to cover the second patterned conductive layer 207 and the light absorption layer 201b. The opening 206 is filled with the second patterned conductive layer 207 such that the second patterned conductive layer 207 is connected with the first portion 204a of the first patterned conductive layer 204. Furthermore, the second patterned conductive layer 207 is also formed with a plurality of light-receiving windows 208. The material and forming method of the second patterned conductive layer 207 may refer to the above-mentioned forming step of the first patterned conductive layer 204. The forming of the conformal anti-reflective layer 209 may employ various conventional deposition techniques. The anti-reflective layer 209 may be made of silicon nitride, silicon oxide, or other suitable material.

FIG. 2I illustrates a photodiode device 2000 according to the present invention, which comprises a light absorption layer 201b, the light absorption layer 201b defines a light-facing side X and a back-light side Y; a via 202 passing through the light absorption layer 201b, and the via 202 defines a side wall 202a and a bottom surface 202b; a conformal isolation layer 203a covering the side wall 202a and the bottom surface 202b; a first patterned conductive layer 204 disposed on the back-light side Y of the light absorption layer 201b, the first patterned conductive layer 204 has a first portion 204a covering the conformal isolation layer 203a; a second patterned conductive layer 207 disposed on the light-facing side X of the light absorption layer 201b; and, an opening 206 passing through the conformal isolation layer 203a, wherein the opening 206 is filled with the second patterned conductive layer 207, such that the second patterned conductive layer 207 is connected with the first portion 204a of the first patterned conductive layer 204. The photodiode device 2000 further comprises a carrying substrate 205, the carrying substrate 205 is connected with the first patterned conductive layer 204. The substrate 205 may be a heat sink device. Moreover, the first patterned conductive layer 204 further comprises a second portion 204b covering a portion of top surface of the light absorption layer 201b. The first portion 204a and the second portion 204b are separated from each other. The conformal isolation layer 203a separates the first portion 204a from the light absorption layer 201b. The first portion 204a is the N-type (or P-type) external contacted electrode, and the second portion 204b is the P-type (or N-type) external contacted electrode. Other components, material or other details of photodiode device 2000 may be referred to the previous description.

The above-mentioned are only the preferred embodiments of the present invention, but not limiting the claims of the present invention; all the equivalent variation or modification without departing from the spirit disclosed by the present invention should be construed falling within the scope of the following claims.

We claim:

1. A photodiode device, comprising:
    a light absorption layer defining a light-facing side and a back-light side, the light absorption layer having at least one p-n junction;
    a via passing through the absorption layer, the via having a side wall and a bottom;
    a patterned conformal isolation layer covering the side wall and the bottom;
    a first patterned conductive layer disposed on the back-light side of the light absorption layer, the first patterned conductive layer having a first portion covering the patterned conformal isolation layer, the conformal isolation layer separating the first portion from the light absorption layer;
    a second patterned conductive layer disposed on the light-facing side of the light absorption layer; and
    an opening passing through the patterned conformal isolation layer, wherein the opening is filled with the second patterned conductive layer such that the second patterned conductive layer is connected to the first portion of the first patterned conductive layer.

2. The photodiode device as claim 1, further comprising a substrate in connection with the first patterned conductive layer.

3. The photodiode device as claim 1, wherein the first patterned conductive layer further comprises a second portion covering a portion of the back-light side the light absorption layer, the first portion being separated from the second portion.

4. The photodiode device as claim 3, further comprising a substrate formed with a first conductive pad in connection with the first portion and a second conductive pad in connection with the second portion.

5. The photodiode device as claim 2, wherein the substrate is a heat dissipation device.

6. The photodiode device as claim 5, wherein the substrate comprises a ceramic substrate, a print circuit board, or a direct copper bonded (DCB) ceramic substrate.

7. The photodiode device as claim 2, wherein the substrate has a thickness ranged from 0.3 micrometer to 1 micrometer.

8. The photodiode device as claim 1, wherein the second patterned conductive layer is formed with a plurality of light-receiving windows.

9. The photodiode device of claim 1, further comprising a conformal anti-reflective layer covering the second patterned conductive layer and the light absorption layer.

* * * * *